United States Patent [19]
Goodrich

[11] Patent Number: 5,349,639
[45] Date of Patent: Sep. 20, 1994

[54] AUTOMATIC ELECTRONIC AUDIO SIGNAL ATTENUATING DEVICE AND METHOD THEREFOR

[76] Inventor: Patrick Goodrich, 13236 N. 7th St., Suite 4-252, Phoenix, Ariz. 85022

[21] Appl. No.: 54,436

[22] Filed: Apr. 30, 1993

[51] Int. Cl.$^5$ .............................................. H04M 1/00
[52] U.S. Cl. ..................... 379/373; 379/90; 379/98; 379/87; 379/101; 379/105; 379/441; 381/77; 381/205
[58] Field of Search ............... 379/373, 90, 101, 98, 379/87, 68, 441, 442, 447, 105; 381/77, 205

[56] References Cited

U.S. PATENT DOCUMENTS 4,425,477  1/1984  Magil ......................... 379/110
5,021,747  6/1991  Isham et al. .................. 330/284

Primary Examiner—James L. Dwyer
Assistant Examiner—Jacques M. Saint-Surin
Attorney, Agent, or Firm—Harry M. Weiss

[57] ABSTRACT

A combined audio system and automatic electronic audio signal attenuating device is disclosed which provides an audio system combined with an automatic electronic audio signal attenuating device comprising an audio attenuation portion for attenuating audio signals and a plurality of network interface portions for controlling the audio attenuation portion in response to changes in telephone system inputs to the network interfaces. In addition, the audio attenuation portion is provided with at least two separate audio input/output connections to provide a plurality of configurations of the attenuating portion to yield different degrees of audio signal attenuation. The combined audio system and automatic electronic audio signal attenuating device can accommodate plurality of telephones in addition to a plurality of audio signal channels.

28 Claims, 1 Drawing Sheet

AUTOMATIC ELECTRONIC AUDIO SIGNAL ATTENUATING DEVICE AND METHOD THEREFOR

FIELD OF THE INVENTION

This invention relates generally to audio system devices and, more specifically, to a combined audio system and automatic electronic audio signal attenuating device and method therefor having an automatic electronic audio signal attenuating device comprising an audio attenuation portion provided with at least two separate audio input/output connections to provide a plurality of configurations of the attenuating portion to yield different degrees of audio signal attenuation and, in addition, a plurality of network interface portions having at least one connection to the audio attenuation portion and at least one connection to a telephone type system for controlling the audio attenuation portion in response to changes to at least one of the telephone system connections.

DESCRIPTION OF THE PRIOR ART

Many of today's more sophisticated stereo systems have features that allow a user to mute or attenuate audio signals, and therefore, the audible output from the system. One example of the usefulness of such sound reduction features is the scenario where a stereo system is being played very loudly when a telephone rings. The simplest form of this sound reduction feature is for the user to turn down the stereo volume using the stereo volume control. In this prior art system, a user must physically turn down the stereo volume control which is typically located on the stereo system receiver. In some cases, such a requirement can be somewhat burdensome. For instance, suppose a user is listening to a stereo at a very high volume level when the telephone rings. If the user hears the phone at all, the phone may have rung several times before the user recognizes the sound of the telephone; therefore, the user most likely has a very short time in order to reach the phone before the caller hangs up. In this situation, it is likely that the user may have to answer the telephone with the music playing at the original high volume level because there is no time to run to the stereo and turn down the volume before the telephone stops ringing. As a result, many stereo users in this situation answer the phone and then turn down the volume of the stereo.

Some stereo systems offer other prior art audio mute features. In these systems, a stereo user depresses a mute actuator such as a button or switch to attenuate the stereo signal, thereby reducing the audible output. This type of audio mute feature has one primary advantage over the volume control approach, namely that in the volume control audio reduction, some users accidently turn the stereo volume all the way up instead of turning the volume down. In some cases, this type of error can cause irreparable damage to the stereo system. With the audio mute switch, there is no danger of overdriving the stereo system. However, even with this audio mute switch, a user must still go to the stereo system in order to reach the audio mute switch that is typically located on the stereo system receiver in order to reduce the audible output sound. As previously explained, such a requirement can be somewhat burdensome when the telephone is ringing while the stereo system is being played at a high volume level.

With the introduction of remote controls for stereo systems, stereo users could mute stereo systems without having to physically touch a portion of the stereo system. However, typical stereo remote control devices also have limitations. For example the effective use of most stereo remote control devices is limited both by the distance and by the angle between the device itself and the stereo receiver. In particular, the typical stereo remote control device of the prior art becomes less effective at controlling the stereo system as the distance between the stereo and the remote control increases. Similarly, as the angle between the front panel of a stereo system and a remote control device increases, the remote control device loses the ability to control the stereo. Given the limitations of these remote control devices of the prior art, a stereo user must still be relatively close to the stereo in order to reduce the volume. In addition, a user might have to spend time looking for the remote control device while the telephone ringing. Regardless of the type of prior art volume reduction system chosen, a user trying to turn down the stereo volume prior to answering a telephone call had to physically go to the stereo receiver and turn down the volume or go find the stereo remote control device and reduce the volume, thereby, in effect, wasting time and increasing the likelihood of missing the telephone call. Therefore, a device was needed to automatically turn down the volume of a stereo upon picking up a telephone receiver.

SUMMARY OF THE INVENTION

In accordance with one embodiment of this invention, it is an object of this invention to provide a combined audio system and automatic electronic audio signal attenuating device and method therefor.

It is another object of this invention to provide a combined audio system and automatic electronic audio signal attenuating device that automatically attenuates audio system signals upon removing a telephone receiver from the "on-hook" position from any one of a number of telephones.

It is yet another object of this invention to provide a combined audio system and automatic electronic audio signal attenuating device providing a plurality of different degrees of audio signal attenuation.

It is a further object of this invention to provide a combined audio system and automatic electronic audio signal attenuating device providing an audio attenuation smoothing portion for minimizing the probability of the occurrence of audible clicking type transients when each of the audio signals is attenuated.

BRIEF DESCRIPTION OF THE PREFERRED EMBODIMENTS

In accordance with one embodiment of this invention, a combined audio system and automatic electronic audio signal attenuating device is disclosed comprising, in combination, audio system means having a plurality of components for transforming audio signals to audible signals, an automatic electronic audio signal attenuating device comprising audio attenuating means having at least first audio input/output connection means and second audio input/output connection means for attenuating the audio signals wherein the audio attenuating means have at least a first and a second configuration together providing a plurality of degrees of audio signal attenuation, and a plurality of network interface means each having at least one input from a telephone system and at least one connection to the audio attenuating means for controlling the audio attenuating means in response to changes in at least one input from the telephone system. In addition, the audio attenuating means comprise a plurality of transistor means connected together for attenuating the audio signals. Moreover, the audio attenuating means is provided with audio attenuation smoothing means for minimizing the occurrence of audible clicking type transients when each of the audio signals is attenuated. The automatic electronic audio signal attenuating device also includes a plurality of signal means each providing a voltage difference between two inputs from the telephone system of each of the plurality of network interface means coupled to a base junction of each of a plurality of transistors for controlling the transistors and, in addition, the automatic electronic audio signal attenuating device includes overload protection means coupled to the audio attenuating means that has at least a resistor for protecting the automatic electronic audio signal attenuating device from high positive or negative voltage surges. The automatic electronic audio signal attenuating device also includes audio fluttering prevention means coupled to the audio attenuating means and having at least a diode for preventing audio signal fluttering.

In accordance with another embodiment of this invention a method of operating a combined audio system and automatic electronic audio signal attenuating device is provided comprising the steps of providing audio system means having a plurality of components for transforming audio signals to audible signals, providing an automatic electronic audio signal attenuating device comprising the steps of providing audio attenuating means having at least first audio input/output connection means and second audio input/output connection means for attenuating the audio signals wherein the audio attenuating means have at least a first and a second configuration together providing a plurality of degrees of audio signal attenuation, and providing a plurality of network interface means each having at least one input from a telephone system and at least one connection to the audio attenuating means for controlling the audio attenuating means in response to changes in at least one input from the telephone system. In addition, this method includes the step of providing the audio attenuating means comprising a plurality of transistor means connected together for attenuating the audio signals. Moreover, the audio attenuating means is provided with audio attenuation smoothing means for minimizing the occurrence of audible clicking type transients when each of the audio signals is attenuated. This method also includes the step of providing a plurality of signal means each providing a voltage difference between two inputs from the telephone system of each of the plurality of network interface means coupled to a base junction of each of a plurality of transistors for controlling the transistors and, in addition, the step of providing the automatic electronic audio signal attenuating device including overload protection means coupled to the audio attenuating means that has at least a resistor for protecting the automatic electronic audio signal attenuating device from high positive or negative voltage surges. This method also includes the step of providing the automatic electronic audio signal attenuating device including audio fluttering prevention means coupled to the audio attenuating means and having at least a diode for preventing audio signal fluttering.

The foregoing and other objects, features, and advantages of the invention will be apparent from the following, more particular description of the preferred embodiments of the invention as illustrated in the accompanying drawings.

DESCRIPTION OF THE PREFERRED EMBODIMENT

Figure 1:
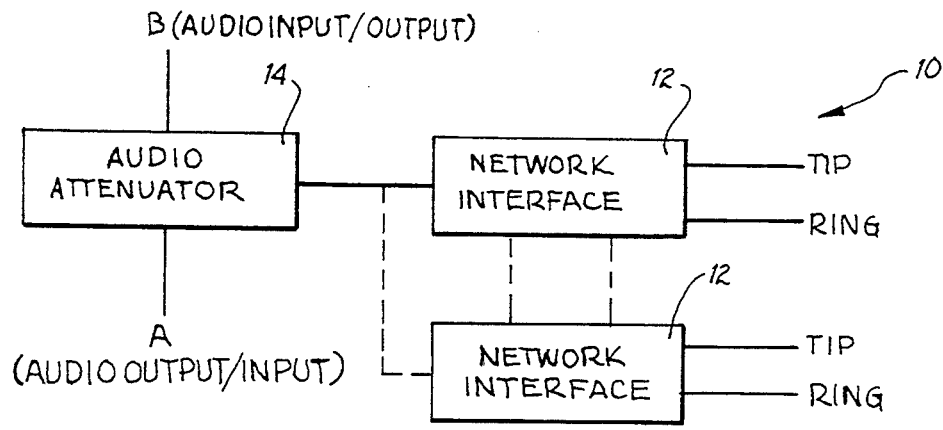
FIG. 1 is a simplified block diagram of one possible embodiment of the automatic electronic audio signal attenuating device showing a plurality of network interface portions coupled to an audio attenuator portion.

Referring to FIG. 1, a block diagram of an automatic electronic audio signal attenuating device is shown and generally designated by reference number 10. A plurality of network interfaces 12 each have a TIP and a RING line that are supplied from a telephone type of system. Each of the plurality of network interfaces 12 is coupled to an audio attenuator 14 having a plurality of audio input/output connections, namely the A and the B audio input/output connection.

Figure 2:
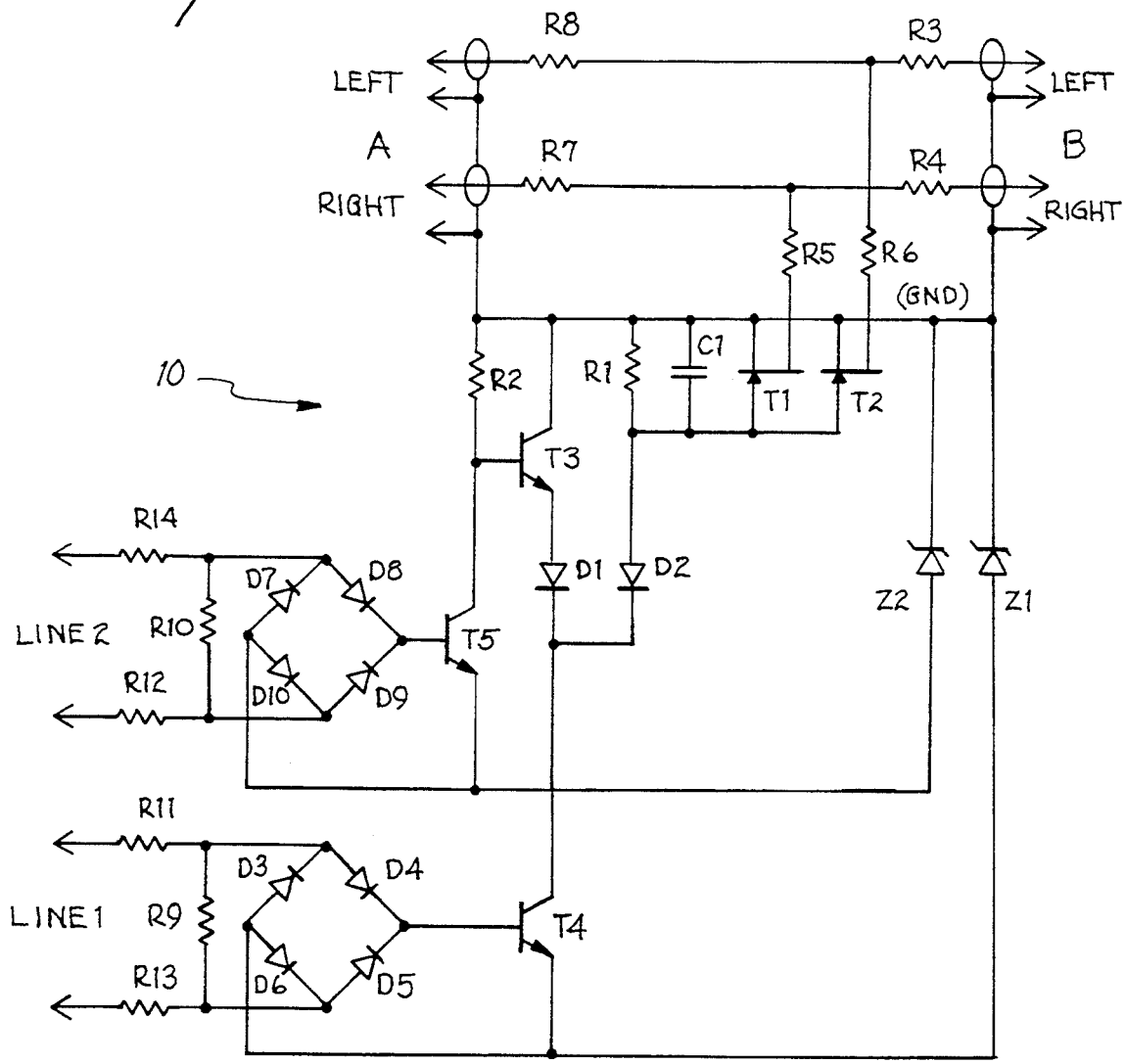
FIG. 2 is a detailed electrical schematic of the automatic electronic audio signal attenuating device shown in FIG. 1.

Referring to FIG. 2, one embodiment of the automatic electronic audio signal attenuating device 10 is shown in detail. One node of a resistor R14 has an input from either the TIP or the RING signal from a telephone system. Similarly, a node of a resistor R12 has an input from either the TIP or the RING signal from a telephone system which is different from the input to R14. A second node of R14 is coupled to a first node of resistor R10 and R12 is coupled to a second node of R10. The first and second nodes of R10 are also coupled to a first and second node of a first bridge comprised of the diodes D7, D8, D9, and D10. A third node of this first bridge is coupled to a base junction of an NPN transistor T5 having an emitter junction coupled to the fourth node of the first bridge.

A second group of resistors R9, R11, and R13 are coupled in an analogous manner to the arrangement described for the respective resistors, namely R10, R14, and R12. The node between R9 and R11 is coupled to a first node of a second bridge comprising diodes D3, D4, D5, and D6 while the node between R9 and R13 is coupled to a second node of the second bridge. A third node of the second bridge is coupled to a base junction of an NPN transistor T4 having an emitter junction coupled to a fourth node of the second bridge.

The emitter of the NPN transistor T5 is also coupled to an input of a zener diode Z2 while the emitter of the NPN transistor T4 is coupled to an input of a different zener diode Z1. Both zener diodes Z1 and Z2 have their output coupled to electrical ground. The collector of the NPN transistor T5 is coupled to both one node of the resistor R2 and to a base junction of another NPN transistor T3. The second node of the resistor R2 and the collector junction of the transistor T3 are coupled to electrical ground. The emitter of transistor T3 is coupled to an input of a diode D1 and the output of diode D1 is coupled with the output of another diode D2 to the collector junction of transistor T4.

The input node of diode D2 is coupled to a first node of both the resistor R1 and the capacitor C1, and, in addition, to each of the gate junctions of both JFET transistors T1 and T2. A second node of the resistor R1 and of the capacitor C1 is coupled to electrical ground. The source junction of each of the JFET transistors T1 and T2 are also coupled to electrical ground. The drain junction of transistor T1 is coupled to a first node of the resistor R5, and the drain junction of transistor T2 is coupled to a first node of the resistor R6. The second node of the resistor R5 is coupled to a node between resistors R4 and R7 while the second node of the resistor R6 is coupled to a node between resistors R3 and R8. Both of the audio input/outputs A and B have at least a left and right channel. The left channel of the A audio input/output has a connection coupled to electrical ground and a connection coupled to a node of resistor R8. In a similar manner, the right channel of the A audio input/output has a connection coupled to electrical ground and a connection coupled to a node of resistor R7. The left channel of the B audio input/output has a connection coupled to electrical ground and a connection coupled to a node of resistor R3 while the right channel of the B audio input/output also has a connection coupled to electrical ground and a connection coupled to a node of resistor R4.

OPERATION

The automatic electronic audio signal attenuating device 10 attenuates audio signals passing through it whenever an OFF-HOOK condition on a telephone line is sensed. In particular, the automatic electronic audio signal attenuating device 10 senses a sufficient voltage between a telephone type system's inputs TIP and RING to determine that a telephone is ON-HOOK and uses the telephone line-power to pinch-off two JFETs T1 and T2, thereby passing audio signals without being attenuated. In the alternative, the automatic electronic audio signal attenuating device 10 also senses a specific voltage between the TIP and RING inputs to determine that a telephone is OFF-HOOK and causes the two JFETs T1 and T2 to conduct, thereby passing a portion of the audio signals to electrical ground to attenuate the audio signals.

The interface to the telephone line begins with a pair of resistors R11 and R13 or R12 and R14 each having a typical resistance value of approximately 18M ohms that are coupled to a full-wave diode bridge. The diode bridges ensure correct operation of the automatic electronic audio signal attenuating device 10 even if the TIP and RING inputs are reversed. The resistors R11 and R13 and the resistors R14 and R12 are the primary current limiting components for the automatic electronic audio signal attenuating device 10. The resistor R9 establishes the threshold voltage to turn on the transistor T4 at approximately 18 volts between the TIP and RING inputs; however, other threshold voltages could be established if desired. Once the transistor T4 detects a telephone line voltage that exceeds the threshold, it conducts through the diode D2 which pulls the gates of the JFETs T1 and T2 below their respective pinch-off voltage to turn on JFETs T1 and T2.

The diode D2 prevents positive excursions that are typically encountered when a telephone rings from discharging the capacitor C1, thereby preventing audio signal flutter during ringing of the telephone. The capacitor C1 also provides a short duration delay as the gates of the JFETs T1 and T2 are pulled below their pinch-off voltages, thereby minimizing the occurrence of clicking type transients of the audio signals as they are attenuated.

Referring to a first scenario where the telephone coupled to a first line 1 and to a second line 2 are both ON-HOOK, the voltage difference between the TIP and RING inputs on each line is greater than the typical threshold voltage of 18 volts. As a result, both of the transistors T4 and T5 are driven ON. The transistor T4 conducts current through the diode D2 to pull the gates of the JFETs T1 and T2 below −10 volts, the typical pinch-off voltage associated with the JFETs T1 and T2. Since the gate voltage of both T1 and T2 is below the pinch-off voltage, neither T1 nor T2 conducts, and, consequently, the audio signals pass through the automatic electronic audio signal attenuating device 10 without being attenuated. The transistor T5 conducts current through the resistor R2 thus preventing the transistor T3 from conducting, thereby the transistor T3 does not affect the current flowing through the transistor T4.

Referring to a second scenario where the telephone coupled to a first line 1 is ON-HOOK and the telephone coupled to a second line 2 is OFF-HOOK, the transistor T4 conducts as in the previous scenario, however, the transistor T5 no longer conducts because line 2 is in the OFF-HOOK condition. The resistor R2 provides the base current to turn ON transistor T3 which conducts through the diode D1 to divert current to the collector of transistor T4. As a result, the gates of the JFETs T1 and T2 are no longer pulled low through diode D2, and the charge in capacitor C1 discharges through resistor R1. Consequently, the gate voltages of JFETs T1 and T2 exceed their pinch-off voltage, and T1 and T2 begin to conduct to pass a portion of the audio signals to electrical ground, thereby producing the desired attenuation.

Referring to a third scenario where the telephone coupled to a first line 1 is OFF-HOOK and the telephone coupled to a second line 2 is ON-HOOK, the transistor T4 stops conducting to eliminate the current sink through diode D2 which is the normal case when line 1 is in the ON-HOOK condition. The charge on capacitor C1 again discharges through the resistor R1 to turn ON JFETs T1 and T2 to attenuate the audio signals. The diode D1 has a special function in this instance. Since the transistor T5 is conducting, the base of the transistor T3 is pulled low. Without the diode D1, the base-emitter junction of transistor T3 would be reverse biased through the diode D2 and the resistor R1 to ground. That voltage could easily exceed the emitter-base breakdown voltage of T3, thereby damaging the transistor T3. The diode D1 is a low-leakage diode that drops any reverse biased voltage to the base-emitter junction of T3 to protect the transistor T3.

In some situations negative voltages may be present at the TIP and/or RING inputs on line 1. This will cause the zener diode Z1 to reach its zener voltage of approximately 30 volts. The resistors R11 and/or R13 limit the current associated with this negative voltage surge. The zener voltage of Z1 is chosen to be below both the collector-emitter breakdown voltage of the transistor T4 and the source-gate breakdown voltage of JFETs T1 and T2, thereby protecting these components. Line 2 and any additional lines are protected in a similar manner.

Any large positive voltage presented to the TIP and/or RING inputs to line 1 cause the zener diode Z1 to go into forward conduction through the base-emitter of the transistor T4, and the diode D2 to become slightly reverse biased. However, the diode D2 prevents the gates of the JFETs T1 and T2 from becoming forward biased, thereby preventing any current from being injected into the audio signal path. As previously defined, the resistors R11 and/or R13 limit the current pulled from the telephone line. Line 2 and any additional lines are protected in a similar manner.

While the invention has been particularly shown and described with reference to the preferred embodiments thereof, it will be understood by those skilled in the art that the foregoing and other changes in form and details may be made therein without departing from the spirit and scope of the invention. For example, since some stereo systems offer more than two audio signal channels, one could alter the automatic electronic audio signal attenuating device of the present invention to accommodate additional channels by using additional JFETs and associated circuitry if desired.

I claim:

1. A combined audio system and automatic electronic audio signal attenuating device, comprising, in combination:
   audio system means having a plurality of components for transforming audio signals to audible signals;
   an automatic electronic audio signal attenuating device comprising:
   audio attenuating means having at least first audio input/output connection means and second audio input/output connection means for attenuating said audio signals, said audio attenuating means having at least a first and a second configuration together providing a plurality of degrees of audio signal attenuation;
   a plurality of network interface means each having at least one input from a telephone system and at least one connection to said audio attenuating means for controlling said audio attenuating means in response to changes to said at least one input from said telephone system; and
   plurality of signal means each providing a voltage difference between two inputs from said telephone system of each of said plurality of network interface means coupled to a base junction of each of a plurality of transistors for controlling said transistors.

2. The device of claim 1 wherein said audio signals are applied as inputs to said first audio input/output connection means and outputted through said second audio input/output connection means for attenuating said audio signals by approximately 20 decibels.

3. The device of claim 1 wherein said audio signals are applied as inputs to said second audio input/output connection means and outputted through said first audio input/output connection means for attenuating said audio signals by approximately 30 decibels.

4. The device of claim 1 wherein said audio attenuating means comprising a plurality of transistor means connected together for attenuating said audio signals.

5. The device of claim 1 wherein said audio attenuating means is provided with audio attenuation smoothing means for minimizing the occurrence of audible clicking type transients when each of said audio signals is attenuated.

6. The device of claim 1 wherein said input from said telephone system of each of said plurality of network interface means supplies power to operate said automatic electronic audio signal attenuating device.

7. The device of claim 1 including overload protection means coupled to said audio attenuating means and having at least a resistor for protecting said automatic electronic audio signal attenuating device from high positive voltage surges.

8. The device of claim 7 wherein said overload protection means protects said automatic electronic audio signal attenuating device from high negative voltage surges.

9. The device of claim 1 including audio fluttering prevention means coupled to said audio attenuating means and having at least a diode for preventing audio signal fluttering.

10. A method of operating a combined audio system and automatic electronic audio signal attenuating device comprising the steps of:
    providing audio system means having a plurality of components for transforming audio signals to audible signals;
    providing an automatic electronic audio signal attenuating device comprising the steps of:
    providing audio attenuating means having at least first audio input/output connection means and second audio input/output connection means for attenuating said audio signals, said audio attenuating means having at least a first and a second configuration together providing a plurality of degrees of audio signal attenuation;
    providing a plurality of network interface means each having at least one input from a telephone system and at least one connection to said audio attenuating means for controlling said audio attenuating means in response to changes to said at least one input from said telephone system; and
    providing a plurality of signal means each having a voltage difference between two inputs from said telephone system of each of said plurality of network interface means coupled to a base junction of each of a plurality of transistors for controlling said transistors.

11. The method of claim 10 wherein said audio signals are applied as inputs to said first audio input/output connection means and outputted through said second audio input/output connection means for attenuating said audio signals by approximately 20 decibels.

12. The method of claim 10 wherein said audio signals are applied as inputs to said second audio input/output connection means and outputted through said first audio input/output connection means for attenuating said audio signals by approximately 30 decibels.

13. The method of claim 10 wherein said audio attenuating means comprising a plurality of transistor means connected together for attenuating said audio signals.

14. The method of claim 10 wherein said audio attenuating means is provided with audio attenuation smoothing means for minimizing the occurrence of audible clicking type transients when each of said audio signals is attenuated.

15. The method of claim 10 wherein said input from said telephone system of each of said plurality of network interface means supplies power to operate said automatic electronic audio signal attenuating device.

16. The method of claim 10 including the step of providing overload protection means coupled to said audio attenuating means and having at least a resistor for protecting said automatic electronic audio signal attenuating device from high positive voltage surges.

17. The method of claim 16 wherein said overload protection means protects said automatic electronic audio signal attenuating device from high negative voltage surges.

18. The method of claim 11 including the step of providing audio fluttering prevention means coupled to said audio attenuating means and having at least a diode for preventing audio signal fluttering.

19. A combined audio system and automatic electronic audio signal attenuating device, comprising, in combination:
audio system means having a plurality of components for transforming audio signals to audible signals;
an automatic electronic audio signal attenuating device comprising:
audio attenuating means having at least first audio input/output connection means and second audio input/output connection means for attenuating said audio signals, said audio attenuating means having at least a first and a second configuration together providing a plurality of degrees of audio signal attenuation; and
network interface means having at least one direct electrical conduit input from a telephone system and at least one connection to said audio attenuating means for controlling said audio attenuating means in response to changes of signals on said at least one direct electrical conduit input from said telephone system, said at least one direct electrical conduit input from said telephone system providing all power necessary to operate said automatic electronic audio signal attenuating device from said telephone system.

20. The device of claim 19 wherein said audio attenuating means is provided with audio attenuation smoothing means for minimizing the occurrence of audible clicking type transients when each of said audio signals is attenuated.

21. The device of claim 19 including overload protection means coupled to said audio attenuating means and having at least a resistor for protecting said automatic electronic audio signal attenuating device from high positive voltage surges.

22. The device of claim 21 wherein said overload protection means protects said automatic electronic audio signal attenuating device from high negative voltage surges.

23. The device of claim 19 including audio fluttering prevention means coupled to said audio attenuating means and having at least a diode for preventing audio signal fluttering.

24. A method of operating a combined audio system and automatic electronic audio signal attenuating device, comprising the steps of:
providing audio system means having a plurality of components for transforming audio signals to audible signals;
operating an automatic electronic audio signal attenuating device comprising the steps of :
providing audio attenuating means having at least first audio input/output connection means and second audio input/output connection means for attenuating said audio signals, said audio attenuating means having at least a first and a second configuration together providing a plurality of degrees of audio signal attenuation; and
providing network interface means having at least one direct electrical conduit input from a telephone system and at least one connection to said audio attenuating means for controlling said audio attenuating means in response to changes of signals on said at least one direct electrical conduit input from said telephone system, said at least one direct electrical conduit input from said telephone system providing all power necessary to operate said automatic electronic audio signal attenuating device from said telephone system.

25. The method of claim 24 wherein said audio attenuating means is provided with audio attenuation smoothing means for minimizing the occurrence of audible clicking type transients when each of said audio signals is attenuated.

26. The method of claim 24 including the step of providing overload protection means coupled to said audio attenuating means and having at least a resistor for protecting said automatic electronic audio signal attenuating device from high positive voltage surges.

27. The method of claim 26 wherein said overload protection means protects said automatic electronic audio signal attenuating device from high negative voltage surges.

28. The method of claim 24 including the step of providing audio fluttering prevention means coupled to said audio attenuating means and having at least a diode for preventing audio signal fluttering.

* * * * *